US006325910B1

(12) United States Patent
Meyer et al.

(10) Patent No.: US 6,325,910 B1
(45) Date of Patent: Dec. 4, 2001

(54) PALLADIUM COLLOID SOLUTION AND ITS UTILIZATION

(75) Inventors: Heinrich Meyer; Lutz Stamp, both of Berlin (DE)

(73) Assignee: Atotch Deutschland GmbH, Berlin (DE)

( * ) Notice: Subject to any disclaimer, the term of this patent is extended or adjusted under 35 U.S.C. 154(b) by 0 days.

(21) Appl. No.: 09/089,578

(22) Filed: Jun. 3, 1998

Related U.S. Application Data

(63) Continuation-in-part of application No. 08/727,493, filed on Jan. 13, 1997, now abandoned.

(30) Foreign Application Priority Data

Aug. 4, 1994 (DE) ................................................ 44 12 463

(51) Int. Cl.$^7$ .............................. C25D 5/54; C25D 5/34; C25D 5/02
(52) U.S. Cl. ......................... 205/159; 205/210; 205/125
(58) Field of Search .................................... 205/159, 170, 205/184, 210, 125; 106/1.05, 1.11; 427/301, 304, 305, 306

(56) References Cited

U.S. PATENT DOCUMENTS

| | | | |
|---|---|---|---|
| 3,011,920 | 12/1961 | Shipley, Jr. | 117/213 |
| 3,647,440 | * 3/1972 | Rasch | 96/29 |
| 4,004,051 | 1/1977 | Kadison et al. | 427/304 |
| 4,634,468 | * 1/1987 | Gulla et al. | 106/1.11 |
| 4,652,311 | 3/1987 | Gulla et al. | 106/1.11 |
| 4,725,314 | 2/1988 | Gulla et al. | 106/1.11 |
| 5,160,452 | 11/1992 | Marutsuka et al. | 252/309 |
| 5,421,989 | * 6/1995 | Stamp et al. | 205/166 |

FOREIGN PATENT DOCUMENTS

| | | |
|---|---|---|
| 42 06 680 | 2/1992 | (DE) . |
| 42 11 152 | 3/1992 | (DE) . |
| 1684302 | * 10/1991 | (SU) . |
| WO 93/17153 | 2/1993 | (WO) . |

OTHER PUBLICATIONS

Naoki Toshima, et al. "Colloidal dispersions of palladium--platinum bimetallic clusters protected by polymers—preparation and application to catalysis." The Chemical Society of Japan. Chemistry Letters (1989): 1769–1772. No Month Available.

Yuan Wang and Hanfam Liu. "Preparation and immobilization of polymer–protected bimetallic colloids." Polymer Bulletin 25:139–144. Springer–Verlag (1991). No Month Available.

L.N. Lewis. "Chemical catalysis by colloids and clusters." Chemical Reviews 93, 2693, 2703, 2704, 2726. American Chemical Society (1993). No Month Available.

Grant & Hackh's Chemical Dictionary, Fifth edition, p. 457, 1987. no month available.*

* cited by examiner

*Primary Examiner*—Edna Wong
(74) *Attorney, Agent, or Firm*—Paul & Paul

(57) ABSTRACT

The invention relates to a palladium colloid solution, which, in addition to a palladium compound, a protective colloid for stabilizing the colloid and a reducing agent, additionally contains noble metals from the group rhodium, iridium and platinum. The solution can be used to treat electrically non-conductive substrate surfaces, particularly in order to metallize the substrate surfaces directly and electrolytically. By means of this method, the nonconductive areas of the holes in printed circuit boards can be directly electrolytically metallized.

12 Claims, No Drawings

PALLADIUM COLLOID SOLUTION AND ITS UTILIZATION

CROSS REFERENCE TO RELATED APPLICATIONS

This application is a continuation-in-part of U.S. patent application Ser. No. 08/727,493 filed Jan. 13, 1997, now abandoned.

BACKGROUND OF THE INVENTION

1. Field of the Invention

The invention relates to a palladium colloid solution, a utilization of the solution for coating electrically non-conductive substrate surfaces with metallic coverings, and a printed circuit board produced by using the solution.

2. Brief Description of the Prior Art

Metallization of electrically non-conductive substrate surfaces is known per se. Electrolytic processes are used for metallizing printed circuit boards, plastics parts for decorative applications and also for functional purposes. To this end the substrate surfaces, after an appropriate pretreatment, are activated with a solution normally containing noble metal, and then metallized in a currentless manner. If necessary, further metal layers may be applied to this first metal layer by means of an electrolytic coating process.

The currentless metallization process however has considerable disadvantages (difficulty of monitoring the process in currentless metallizing baths, use of formaldehyde as a reducing agent, which is suspected of being carcinogenic, utilization of complex formers which are difficult to handle in terms of waste water disposal). For this purpose, efforts were made in the past to develop better processes. In some processes, the process step of currentless metallization needed to generate the electrical surface conductivity, is no longer necessary.

The electrical surface conductivity necessary for electrolytic metallization is in this case for example generated by means of intrinsically conductive organic polymers, these being applied as a thin layer to the surfaces. In DE 38 06 884 C1, DE 39 23 832 A1, :DE 39 31 003 A1, EP 0 206 133 A1 and EP 0 413 109 A2, there are described methods which use such polymer layers and subsequent metallization. In these methods the conductive form of the polymer is generated by an acidic or oxidizing subsequent treatment of the monomer adsorbed on the substrate surface, in which the monomer is polymerized. A disadvantage however is that the conductive polymer layer is applied not only to the non-conductive substrate surfaces, but is also deposited on metallic surfaces such for example as the copper surfaces on printed circuit boards, so that subsequently deposited metal layers do not adhere sufficiently securely on these metal surfaces.

In another variant of the method, the surfaces with the conductive organic polymer layer are coated after treatment with an activator containing noble metal (DE 42 11 152 C1).

In another alternative method, disclosed in the documents DE 39 39 676 C1, DE 41 12 462 A1, DE 42 27 836 A1 and GB 22 43 833A, the conductive polymer layer is formed only on the non-conductive surfaces, the nonconductive monomer reacting in an acidic solution directly with the oxidation agent adsorbed on the non-conductive substrate surfaces. However, the monomer compounds used, from which the conductive polymer film is generated, are, as in the preceding variant of the method, relatively volatile, so that special precautionary measures have to be taken in order to protect working personnel.

Furthermore, as disclosed in U.S. Pat. No. 4,631,117, U.S. Pat. No. 4,874,477, DE 41 41 416 A1 and WO 92/19092, thin carbon layers may be applied to the substrate surfaces in order to generate the surface conductivity. In this case also the conductive layers form not only on the non-conductive areas of the substrate surfaces, but on metallic surface areas. Therefore the carbon layers must be removed from these areas before metallization. This requires an additional process step.

In a further alternative method, the first conductive layer required for electrolytic metallization is generated by treatment in solutions containing noble metal. Various alternative methods are described for this purpose.

According to U.S. Pat. No. 3,099,608, the substrate surfaces are firstly treated with a palladium/tin oxide-colloid solution and then with a solution by means of which the adsorbed tin compounds are again removed from the surfaces. The surfaces can then be metallized with a copper solution containing pyrophosphate.

According to DE 33 04 004 A1, the surfaces are likewise treated with a palladium/tin oxide-colloid solution and then with a solution for removing the tin compounds. Thereafter electrolytic metallization can take place.

According to DE 33 23 476 C2 the surfaces are also treated with a palladium/tin oxide-colloid solution and then with a solution by means of which adsorbed tin compounds are removed from the surfaces. The surfaces are metallized with copper baths with special organic compounds which enable the preferred separation of the surface areas coated with palladium colloid.

According to DE 37 41 459 C1 the substrate surfaces, after a catalytic activation, for example with a palladium/tin oxide-colloid solution, are treated with a solution containing nitrogenous compounds, for example polyvinylpyrrolidone, and are thereafter electrolytically metallized.

According to U.S. Pat. No. 4,790,913 and U.S. Pat. No. 4,891,069 the surfaces are treated with a palladium/tin oxide-colloid solution which additionally contains a stabilizer and a promoter, the hydrogen occurring during the electrolytic deposition being taken up by the absorbed palladium colloid and reinforcing the electrolytic metallization. Salts of aluminum, titanium, zirconium and hafnium and as promoter materials such as organic hydroxy, thiourea compounds, surface-active compounds, amino acids, polycarboxylic acids, and water-soluble polymers are used. Thereafter electrolytic metallization can take place.

According to U.S. Pat. No. 5,071,517, the surfaces are treated with a palladium/tin oxide-colloid solution and then with a weakly alkaline solution for removing the tin compounds. Thereafter electrolytic metallization can take place.

According to EP 0 398 019 A1 the substrate surfaces, before treatment with a solution containing metal, such for example as a palladium/tin oxide-colloid solution, are treated with a solution which contains a surface-active compound and which reinforces the absorption of metal.

The above named methods have the disadvantage that a sufficiently dense and pore-free metal coating can only be deposited, and a sufficiently high degree of adhesion of the deposited metal film on the metallic areas, for example on the copper surfaces of a printed circuit board, can only be achieved in a narrow range of process parameters chosen, which can scarcely be maintained during industrial application of the methods.

According to U.S. Pat. No. 3,984,290, in a further alternative method, there is deposited on the entire surface of the substrate a more electropositive (nobler) metal than the metal present on the substrate in specific areas. During metallization of printed circuit boards, for example, palladium or silver is applied to the copper surfaces and the non-conductive areas. Then the metal coating formed is treated with an etching solution, which attacks only the original metal surfaces (copper), so that the nobler metal film formed is again removed from the original metal surfaces. Thereafter electrolytic metallization can take place. According to a variant of the method the substrate surfaces are treated, in conjunction with coating with the nobler metal, with a solution containing chalcogen compounds.

In a further variant of the method, the substrate surfaces are firstly treated with a colloid solution containing a noble metal, and then with a solution containing chalcogenide compounds. In this way the adsorbed noble metal is converted into a highly conductive noble metal-chalcogenide compound which is stable against chemical influences. More typically, a palladium/tin oxide-colloid solution is used as an activator and sodium sulphide as a chalcogenide compound (U.S. Pat. No. 4,895,739, U.S. Pat. No. 4,952,286, U.S. Pat. No. 5,007,990, U.S. Pat. No. 5,017,742).

According to U.S. Pat. No. 4,810,333, the substrate surfaces are first treated with an alkaline permanganate solution. There then forms on the substrate surfaces a manganese dioxide layer by a reaction of the permanganate with the organic material of the substrate. This layer is subsequently treated with a chalcogenide solution and then with a noble metal solution. Thereafter electrolytic metallization is carried out.

The treatment with the chalcogenide solution however leads, on metallic areas of the substrate surfaces, to a formation of metallic chalcogenides, so that these metallic chalcogenide layers must be removed before the subsequent electrolytic metallization by an etching process from the metal surfaces, in order to obtain sufficient adhesion of the deposited metal on the metal substrate. The etching process must be carried out within narrow parameter limits, in order on the one hand not to damage the formed conductive layer, and on the other hand to remove the entire metallic chalcogenide layer from the metal surfaces.

According to U.S. Pat. No. 4,919,768, the surfaces to be coated are firstly treated with a solution containing tin (II) ions, then with a chalcogenide solution and thereafter with a solution of a noble metal, for example with palladium chloride. Then the pretreated substrate surfaces can be electrolytically metallized.

In this case also the metallic chalcogenide layer formed must be removed from the metallic areas of the substrate in an etching process. The same problems arise as in the first case mentioned.

In all processes in which colloidal noble metal solutions and in particular palladium/tin oxide-colloid solutions are used, there exists the problem that the colloidal solutions are oxidation-sensitive. This is due above all to the easy oxidation of the tin (II) compounds into tin (IV) compounds. Due to oxidation of the tin compounds, the stabilizing effect on the colloid solution of the tin (II) ions is lost, as tin (IV) ions do not have a stabilizing effect. In this way the colloid coagulates, and palladium is precipitated.

In addition, only a limited palladium concentration can be adsorbed on the substrate surfaces from palladium/tin oxide-colloid solutions. Therefore the capacity for metallization of palladium layers, which are adsorbed from these colloids, is less than that of colloid solutions stabilized with organic protective colloids.

Another noble metal colloid solution is described in DE 42 03 577 A1. In this case there are involved colloids of the noble metal oxides which, after adsorption on the non-conductive substrate surfaces, must be reduced by a further treatment step to the corresponding metals.

Noble metal solutions stabilized with organic protective colloids are less sensitive to oxidation than the palladium/tin oxide-colloid solutions mentioned above. In U.S. Pat. No. 4,004,051, U.S. Pat. No. 4,634,468, U.S. Pat. No. 4,652,311 and U.S. Pat. No. 4,725,314, such noble metal solutions are described for processes with currentless metallization baths, preferably with alkaline copper baths.

In a further alternative method for direct electrolytic metallization, the substrate surfaces according to DE 42 06 680 C2 are treated with noble metal colloid solutions stabilized with organic protective colloids instead of with tin compounds. In addition, in order to remove the adsorbed protective colloid compounds from the substrate surfaces, a solution is used which contains sulphur compounds with sulphur in the oxidation stage of +1 to +5. This method has the advantage that coating of the non-conductive surface areas with the noble metal colloid is successful without deposition of a disturbing layer on the metallic areas of the surfaces to be coated.

However, the noble metal colloid solutions stabilized with organic protective colloids are also oxidation-sensitive, as the colloidal noble metal reacts with atmospheric oxygen, which is carried into the solution. In an acidic solution, the colloidal palladium is transferred by oxidation into soluble palladium salts, so that the noble metal colloid is destroyed. The colloid solutions react particularly in the use of continuous installations used for manufacturing printed circuit boards and in which the treatment solutions are sprayed or splashed onto the horizontally guided printed circuit boards, with oxygen, as the solutions in this case are intensively moved, and they therefore come more intensively into contact with air than when a dipping process is used.

SUMMARY OF THE INVENTION

Therefore the problem underlying the present invention is to avoid the disadvantages of prior art and to find a palladium colloid solution with low oxidation sensitivity and a method enabling electrically non-conductive substrate surfaces to be coated with metal by a direct electrolytic deposition of metal.

This problem is solved by the present invention. Preferred embodiments of the invention are described in the subclaims.

The palladium colloid solution according to the invention is characterized by additional contents of noble metals, selected from the group iridium, rhodium and platinum or compounds of these metals or their mixtures. By means of these additionally contained noble metals, the problem of oxidation sensitivity of such noble metal colloid solutions is avoided. These solutions may without difficulty be brought intensely into contact with atmospheric oxygen even over a lengthy period without their effectiveness being thereby impaired. For example in continuously-operating plants used in the manufacture of printed circuit boards, these solutions come intensively into contact with oxygen, as the solutions are applied to the material to be coated through spray or splash nozzles, the oxygen being taken up by the solution in the spray or splash jet. In the same installations, these solutions are also returned from the printed circuit boards again into the liquid reservoir which is usually disposed underneath, the liquid, depending on the construction of the treatment device, passing back for example in free fall or over guide planes into the liquid reservoir. Here also there is an intimate contact of the solution with atmospheric oxygen.

As the solutions are less oxidation-sensitive than the known colloid solutions, far less reducing agent is necessary in the use and supplementation of the colloid solutions containing the additional noble metal, without the electrochemical reduction/oxidation potential in the solution, necessary for the function of the colloid solution, being displaced from a negative operating value to a positive value. From this there arises the further advantage that during use of the solutions, fewer chemicals are consumed.

Moreover, the proportion of copper ions in these solutions, which arises through slow dissolution of copper substrates in contact with the solution, for example of printed circuit boards, is less critical than in the case of known palladium colloid solutions. In these colloid solutions, the consumption of reducing agent increases in the solutions, in order to obtain their efficiency, as soon as a critical upper limit of the copper concentration is exceeded. Therefore the consumption of reducing agents in solutions in which a large printed circuit board surface has been processed is considerable. As soon as the critical upper limit of the copper concentration in these solutions has been reached, a negative electrochemical reduction/oxidation potential can no longer be maintained in the colloid solution, even by further addition of reducing agents, so that the colloid solution becomes ineffective for substrate treatment.

The critical upper limit of copper concentration therefore lies very much higher for the solutions according to the invention than for colloid solutions without additional noble metals. A large printed circuit board surface can be treated in the colloid solution before this concentration limit is reached. Therefore fewer of the chemicals, which are expensive particularly because of the noble metal content in the colloid solution, is necessary for the reconstitution of such baths.

In colloid solutions containing hypophosphite as a reducing agent, phosphite (which forms in these colloid solutions from hypophosphite), in addition to hypophosphite, is also active as a reducing agent, when the additional noble metals are added to the palladium colloid solution. In this way the degree of effectiveness of the added hypophosphite as a reducing agent is appreciably increased.

The advantages obtained by the addition of the additional noble metals to the palladium colloid solution are extraordinarily surprising as it is not possible to successfully metallize electrically non-conductive substrate surfaces in a directly electrolytic manner, if, for the pre-treatment of these substrate surfaces, colloid solutions produced only with the noble metals rhodium, iridium or platinum are used. In addition, colloid solutions of the additional noble metals cannot be produced without palladium under the conditions preferred for formation of the palladium colloid.

DETAILED DESCRIPTION OF THE PREFERRED EMBODIMENTS

In order to produce the novel colloid solution, firstly a palladium colloid parent solution is prepared according to known methods. For this purpose for example a solution of a palladium compound is combined with an organic protective colloid and then mixed with a solution of a reducing agent. In this case the organic protective colloid serves to stabilize the palladium colloid solution against undesirable palladium flocculation. Aqueous solutions are preferably used, which can in addition contain organic solvents, for example in order to enable the solubility of specific compounds in the colloid solution or the initial materials required for manufacture of the colloid solution to be achieved in their initial solutions. Such colloid solutions are described also in the publications U.S. Pat. No. 4,004,051, U.S. Pat. No. 4,634,468, U.S. Pat. No. 4,652,311 and U.S. Pat. No. 4,725,314. Therefore the procedure for manufacturing the palladium colloid parent solution can be seen in these documents.

There may be used as palladium compounds all materials which are reducible to metallic palladium by reducing agents, which are easy to handle and which dissolve sufficiently well in the initial solution or by dissolution in the initial solution into soluble compounds. Suitable materials are inorganic salts such for example as chlorides, sulphates, nitrates, phosphates, pyrophosphates, cyanides and fluoroborates, organic salts, for example of carboxylic acids, such as formic, ethanoic, succinic, malic, lactic, citric, ascorbic, oxalic, benzoic and vanillic acids, and complex compounds such for example as ammin, halogen complexes and complexes with organic complex formers. Palladium (II) chloride and palladium (II) sulphate in an aqueous hydrochloric solution have proved particularly suitable.

Palladium compounds can be dissolved in an aqueous solution, if necessary with proportions of organic solvents. Water is preferred for economic reasons as a solvent in the colloid solution.

The palladium concentration in the colloid solution lies in the range from 50 mg/l to 1000 mg/l solution, preferably from 100 mg/l to 500 mg/l solution. It is advantageous to set as small a palladium concentration as possible, approximately from 250 mg/l solution, in order to minimize the loss of expensive palladium by carry-over of the solution when dipping and retrieving the substrates to be coated. On the other hand, the concentration selected must be of such a height that sufficient adsorption of the palladium is obtained on the substrate surfaces in order to enable the surfaces to be metallized subsequently without difficulty.

In order to stabilize the colloid solution to be manufactured, organic compounds are used as protective colloids. For this purpose either ionic or non-ionaic, preferably water-soluble polymers are used. On the one hand, natural polymers such for example as proteins, peptides, polysaccharides, gelatins, agar-agar, gum arabic, tannin, and on the other hand synthetic polymers and compounds such for example as alkyl or hydroxyalkylcellulose, polyvinyl pyridine, polyvinyl methylketone, polyvinyl alcohol, polyvinyl acctate, polyirnine pyroladon, methylketone, alcohol, acetate, polyamine, polyacrylic acid, polyacrylamide, polyacrylates and their other derivates, polyethylene glycol, its derivates and its copolymers, and the mixtures of these compounds with one another are suitable. Polyvinylpyrrolidone and in particular poly(4-vinylpyrrolidone) is particularly suitable. The molecular weight of these materials should be within a range of 1,000 g/mol to 10,000,000 g/mol, preferably however within the range of 2,000 g/mol to 2,000,000 g/mol and particularly preferably within a range of 3,000 g/mol to 1,000,000 g/mol. The weight ratio of these materials to palladium in the colloid solution should be set within a range of 1:1 to 100:1 and preferably within a range of 3:1 to 10:1.

There are used as reducing agents compounds which are capable of reducing the palladium compounds to metallic palladium. The function of the reducing agents however consists also in maintaining the electrochemical reduction/ oxidation potential in the colloid solution within a specific negative range, while preventing undesired side reactions, for example oxidation of the colloid. The concentration of the reducing agent is therefore so selected that a sufficiently negative reduction/oxidation potential value in the solution is obtained.

Among others, suitable reducing agents are compounds from the compound classes of the low alkylaminoboric hydrides (mono-, di-, trialklyaminoboric hydrides), such for example as dimethalaminoboric hydride, alkali metal boric hydrides such as lithium, sodium, potassium boric hydrides and in particular sodium boric hydride, ascorbic acid, isoascorbic acid, metal hypophosphite, preferably alkali metal hypophosphite, such for example as sodium hypophosphite, hypophosphorous acid, metal phosphite, preferably alkali metal phosphite, such for example as sodium phosphite, phosphorous acid, formic acid, formaldehyde, hydrazine and its derivates, such for example as hydrazine hydrate and its salts hydrazine sulphate, formiate, dichloride, mononitrate, monochloride, oxalate, hypophosphite, phosphite, orthophosphate, and tartrate and its derivates 1, 1-dimethylhydrazine, 1, 2-dimethylhydrazine, methyl hydrazine, ethylhydrazine, phenylhydrazine, iso-propylhydrazine and its hydrochlorides and hydrazoethanic acid, further hydroxylamine and its derivates such for example as alpha- and beta-hydroxylamines. Among the latter there belong the compounds of the alpha and beta alkylhydroxylamines with 1 to 5 carbon atoms in the either linear or branched alkyl group, such for example as alpha-beta-methylhydroxylamine, alpha, and beta, ethylhydroxylamine, and further alpha-beta-arylhydroxylamine, aryl being phenyl, benzyl or naphthyl, and substituted with one or a plurality of low alkyl groups, such for example as alpha-beta-phenylhydroxylamine.

The colloid solution can further contain halogenide ions, for example chloride ions, in a concentration of 0.1 to 50 g/l solution, their proportion arising via the stoichiometric ratio to palladium in the palladium compound. In this way the stability of the colloid solution is increased and the electrolytic metal deposition carried out after treatment with the colloid solution is simplified. It has become apparent that an increased proportion of halogenide ions in the colloid solution leads to an accelerated metal coating. If, based on the stoichiometric ratio in the palladium compound, halogenized ions are contained in the palladium solution required for producing the colloid solution, these also stabilize the solution against undesired precipitation of palladium compounds.

The pH value of the colloid solution likewise has an influence on the subsequent electrolytic metallization. The solution should preferably be set in the acidic range, preferably in the pH range from 1 to 3 and particularly in the pH range from 1.2 to 2.0. As soon as the colloid solution has been set at acidic, the palladium colloid becomes more effectively adsorbed on the substrate surfaces. Moreover, the colloid stability against flocculation of palladium is increased.

In order to produce the palladium colloid parent solution, the initial solution containing palladium is mixed with the preferably aqueous solution of the reducing agent. After mixing, the solution is heated to an increased temperature, for example to a temperature of 50 to 70° C., and if necessary further reducing agent is added. During mixing, a presented solution is intensively agitated/stirred, in order to favor the formation of smaller colloid particles. It is assumed that colloid particles will form in a range of magnitude from 10 Angstrom to approximately 500 Angstrom. The precise size is not known. Presumably particles which attain a size of approximately 10 $\mu$m, no longer adhere securely to the substrate surfaces. Therefore a colloid with particle sizes in this order of magnitude may no longer be effective. On the other hand, smaller particles are particularly sensitive to oxidation, as their specific surface is greater than that of larger particles.

The particle size in the colloid solutions depends on various external influences and is controlled by the competition between nuclear formation and nuclear growth speed. It is generally known that the particles are smaller the more rapidly the solutions are mixed, and the higher the temperature during mixture of the solutions and the higher the concentration of reducing agents and palladium in the solutions. Further, smaller colloid particles arise particularly when strong reducing agents are used.

After mixture of the individual ingredients of the colloid solution, the increased temperature is maintained for several hours longer, for example for a further 24 hours. Thereafter the additional noble metals are added, preferably after the solution has been cooled to a temperature of 20 to 54° C. Rhodium, iridium and platinum are used as additional noble metals. Preferably the trivalent rhodium and iridium and the bivalent platinum compounds, basically however also other compounds of these metals, may be used. The noble metals may be added to the solution for example as salts, and more typically can be added in the form of halogenide salts, sulphates, hydroxides, cyanides, phosphates, pyrophosphates, phosphites, hypophosphites, fluoroborates, carboxylic acid salts, such for example as the salts of formic, ethanoic, succinic, malic, lactic, citric, ascorbic, oxalic, benzoic or vanillic acid, and complex compounds such for example as ammin, halogen complexes and complexes with organic complex formers.

The concentration of the additional noble metals in the colloid solution is set in dependence on the palladium content. Preferred weight ratios of additional noble metal to palladium are 0.01:10 to 1.0:10.

Specific surface structures of the additional noble metal on the colloid particles are possibly responsible for achieving the resistance of the colloid solution to oxidation. In order to understand the effect of these structures, the possible reactions are represented in a hypocolloid solution containing hypophosphite as a reducing agent. In this respect reference is made to the reaction diagram given below (the following meanings are indicated: (ads): adsorbed compound (gel): compound dissolved in solution, (gas): compound in the gas phase):

Reaction (1) describes the deactivating effect of the dissolved oxygen for the colloid solution, in which palladium is oxidized into palladium (II) ions. According to reaction (5) hypophosphite is oxidized catalytically into phosphite, forming hydrogen. Reactions (2) and (3) illustrate possible consumption reactions for dissolved oxygen. It should be noted in this respect that according to reaction (4) hydrogen probably desorbs very quickly from the palladium colloid particle surface, so that the surface-catalyzed oxidation of the hydrogen by means of oxygen to water according to reaction (3) is only possible to a secondary degree. On the other hand, according to reaction (2) phosphite is only very slowly oxidized to orthophosphate. Therefore, in the stationary condition, a high content of dissolved hydrogen occurs. This reinforces reaction (1).

Reaction diagram:

$$Pd^\circ + \tfrac{1}{2} O_2 (ads) + 2H^+ \rightleftharpoons Pd^{2} + H_2O \quad (1)$$

$$H_3PO_3 (ads) + \tfrac{1}{2} O_2 (ads) \rightleftharpoons H_3PO_4 \quad (2)$$

$$H_2 (ads) + \tfrac{1}{2} O_2 (ads) \rightleftharpoons H_2O \quad (3)$$
$$\text{rapid} \qquad \text{rapid}$$

$$H_2 (ads) \rightleftharpoons H_2 (gel) \rightleftharpoons H_2 (gas) \quad (4)$$

$$H_3PO_2 (ads) + H_2O \rightleftharpoons H_2 (ads) + H_3PO_3 (ads) \quad (5)$$

Copper ions in the colloid solution, the concentration of which, for example, can increase in the presence of oxygen by dissolution of copper from the surfaces of the printed circuit boards in the solution, clearly reinforce reaction (1) and inhibit reactions (2) and (3).

One effect of the surface structures of the additional metal on the colloid particles could for example consist in catalyzing the oxidation of the phosphite to orthophosphate with oxygen according to reaction (2), in order to accelerate the consumption of dissolved oxygen. In this way the stationary concentration of dissolved oxygen would be clearly reduced. In fact a negative electrochemical reduction/oxidation potential can be maintained by the addition of phosphite to the colloid solution even during the action of atmospheric oxygen. This effect on the other hand is not observed without additional noble metals in the colloid solution.

After addition of the additional noble metals, the colloid solution may be used in a metallization process.

It has proved advantageous to monitor the colloid solution by measuring the electrochemical reduction/oxidation potential. This is particularly necessary when using reducing agents which decompose catalytically in the colloid solution, such for example as with borohydride and hypophosphite compounds, in order to achieve the required process reliability. In order to measure the electrochemical reduction/oxidation potential, the voltage between a metal electrode submerged in the colloid solution, for example a gold or platinum electrode, and a second electrode which adopts a predetermined potential in the solution, is measured. Any electrochemical standard electrode such for example as a silver/ silver chloride or calomel electrode may be used as a second electrode. The potential which occurs after production of the colloid solution at the measurement electrode, measured against a silver/silver chloride standard electrode, should lie in the range between approximately −170 mV to approximately −300 mV. Under this measurement, the colloid solution can be monitored. If necessary, the reducing agent can be automatically supplemented, as soon as the potential becomes more positive for example than −170 mV.

In order to provide metal coating on substrate surfaces, the latter are pre-treated according to known methods. For example, resin impurities of copper surfaces on printed circuit boards are removed by resin etching methods (for example by a permanganate process with the process steps pre-swelling, etching in alkaline permanganate solution, reducing the formed manganese dioxide and oxide layers from the copper surfaces by copper-etching (for example with hydrogen peroxide/sulphuric acid solutions). Further, a solution containing a wetting agent may be used to wet the resin surfaces. Suitable for this among other things are non-ionic wetting agents such for example as ethoxylized alkylphenol ether and polyethylene glycol (Handbook of Printed Circuit Technology, 1993, Volume 3, Pages 61 to 69).

After this pre-treatment, in which the surfaces achieve hydrophilic properties, the latter are conditioned in order to reinforce the subsequent adsorption of the palladium colloid. Complex forming and/or cationic surface active compounds are used as conditioning agents. Typical cationic surface active compounds are quoted in U.S. Pat. No. 4,359,537. These involve emulsion copolymers which are converted by generally known methods into positively-charged ion exchanger resins by chemical reaction.

There may be used as complex-forming compounds which have a conditioning action, those compounds which for example are quoted in Kirk-Other, Encyclopedia of Chemical Technology, Third Edition, Volume 5, Pages 339 to 368.

Compounds containing nitrogen and with a chemical affinity to noble metal are preferably used as conditioning compounds. These involve in particular cationic wetting agents, such for example as trimethylalkyl-ammonium halogenides with a short chain length of the alkyl residue, polyelectrolytes, for example quaternary compounds (for example the polyquaternary compounds named in DE 37 43 740 A1, DE 37 43 741 A1, DE 37 43 742 A1, DE 37 43 743 A1, DE 37 43 744 A1, and DE 35 30 617 A1), and in particular the polyquaternary polyvinylimidazoles, and complex formers containing nitrogen such for example as the lower alkanolamines, the alkyl group containing 1 to 5 carbon atoms and being linear or branched. Further low alkanolamines, which may be used as conditioning agents, include diethanolamine, triethanolamine, monoisopropanolamine, diisopropanolamine, triisopropanolamine, mono-secbutanolamine, di-sec-butanolamine, 2-amino-2-methyl-1-propandiol, 2-amino-2-ethyl-1,3-propandiol, 2-dimethylamino-2-methyl-1-propanol, tris (hydroxylmethyl)-amino methane, and various mixtures (hydroxylmethyl)-amino methane, and various mixtures of the alkanolamines.

During substrate treatment, a temperature of 35° C. to 60° C. is preferably set in the conditioning solution. However, a higher temperature, up to the boiling point of the solution, or a lower temperature, may be selected. The treatment time can be extraordinarily short; basically, a few seconds are sufficient for conditioning the substrate surfaces. An upper threshold arises only from economic considerations. Treatment times of about 5 minutes are advantageous.

After conditioning and the subsequent rinsing of the substrate surfaces, the latter are preferably treated in a solution which substantially contains reducing agents. In this way the loss of reducing agent in the colloid solution by carry-over upon dipping and removing the substrate is minimized. The temperature of this solution can likewise be at room temperature. However, a higher temperature up to the boiling point of the solution can be selected.

Thereafter the substrate is brought into contact directly with the colloid solution without further rinsing processes. In this case the palladium colloid particles are adsorbed on to the conditioned electrically non-conductive substrate surfaces and prepare these for metallization. The colloid solution is heated to a temperature increased in comparison to room temperature, for example 40° C.; the treatment time should not be considerably less than 20 seconds. An advantageous treatment time lies between 2 and 7 minutes.

If necessary, the substrate surfaces are then again rinsed and thereafter brought into contact with a treatment solution, in which there is a chalcogen compound with chalcogen in the oxidation stages +1 to +5. Preferably suitable are sulphur compounds and in particular the compounds from the substance classes of the sulphinic acids, particularly with 1 to 5 carbon atoms with a linear or branched alkyl chain, sulphites, thiosulphates, sulphides, sulphones, dithionite, dithionate and other compounds. In this respect, particularly suitable materials have proved to be the compounds hydroxymethanesulphinic acid, alkalisulphate and alkalithiosulphate. Mixtures of these compounds may also be advantageously used. Basically, the corresponding selenium and tellurium compounds are suitable. A particularly suitable solution for after treatment of substrate surfaces contains basically in addition to sodium thiosulphate, also sodium citrate.

A temperature of this solution increased above room temperature (25° C.) is not necessary. The treatment time can be selected within wide ranges, without any influence on the result of treatment. Therefore times of at least a few seconds are sufficient. A favorable treatment time lies between 1 and 2 minutes.

Probably, the organic protective colloid layer, which has been adsorbed by the treatment with the colloid solution on the substrate surfaces, is removed therefrom by treatment with this solution, so that the palladium colloid particles are released and thus can develop their action for the subsequent metallization.

After this treatment and the subsequent rinsing of the substrate surfaces, the latter can be metallized. The metal layer may be deposited electrolytically, without a currentless metal layer being previously applied. Basically all electrically depositable metals, such for example as the metals copper, nickel, silver, gold, palladium, cobalt, tin, lead, zinc, chromium, cadmium, iron and their alloys and their mixtures with one another and with other elements, for example phosphorus and boron, can be considered as metals. For deposition of copper, for example a sulphuric acid copper sulphate solution (for example electrolytic copper bath CUPRACID® of the firm Atotech Deutschland GmbH, Berlin, Germany) is used. Naturally, further metals may also be deposited on the first metal layer.

Furthermore, the colloid solution containing the additional noble metals may also be used as an activator for the previously known currentless metallization. Such methods are described for example in the U.S. Pat. No. 4,634,468. An additional variant of the method, which is not disclosed in the above document, consists in treating the substrate according to the above statements after treatment with the colloid solution with the chalcogen solution described above.

For metallization, the substrate surfaces may be treated in a dipping process. The advantages of the colloid solution containing the additional noble metals become apparent in particular however when using spray and splash jets, as the oxidation-sensitivity of the known palladium colloid solutions has a particularly disadvantageous effect above all in these treatment methods.

By means of the advantageous effect of the additional noble metals in the colloid solution, the new palladium colloid solutions are clearly more stable against oxidation than the known colloid solutions.

In order to metallize drilled, stamped holes or holes produced in any other way in printed circuit boards, these are treated both in the conventional dipping process and also in continuous processes with the colloid solutions according to the invention. In continuous-flow installations, the printed circuit boards are moved horizontally in the treatment plant, and brought into contact with the treatment solutions by means of splash or spray nozzles. Therefore the novel colloid solution is particularly suitable for this application. Treatment of the printed circuit boards in continuous-flow installations without addition of the additional noble metals to the palladium colloid solution is industrially and economically impossible.

The palladium colloid solution containing the additional noble metals can be used to metallize various substrates. In addition to metallizing holes in printed circuit boards, other substrates for electronics, such for example as hybrid carriers or integrated circuits and multi-chip modules, as well as plastics for the range of decorative applications, such for example as in automobile trimming, in sanitary technology, for furniture fittings, costume jewelry, and in the functional regions such for example as for casings shielded against electromagnetic radiation and reflectors, can be coated with this solution for subsequent metallization.

The following examples are intended to explain the invention in more detail:

EXAMPLE 1

A palladium colloid solution was produced by mixing two solutions:

Solution 1: dissolution of 4 g palladium (II) chloride in 27 ml aqueous concentrated hydrochloric acid (37% by weight).

Supplementation of the solution with de-ionized water to 1 liter solution.

Dissolution of 20 g poly (4-vinylpyrrolidon) in the solution.

Solution 2: provision of 1 liter de-ionized water.

Dissolution of 50 g sodium hyphosphite, $NaH_2PO_2H_2O$.

Firstly 800 ml de-ionized water was placed in a container, then 100 ml of solution 1 was added to the water and thereafter 30 ml of solution 2 was added. Then the solution was heated to 70° C. During heating, a further 70 ml of solution 2 was added slowly and with continuous stirring. Then the solution became slowly dark in color.

Solution 3: dissolution of 1.5 g rhodium (III) chloride or 1.0 g rhodium (III) oxide hydrate in 25 ml aqueous concentrated hydrochloric acid (37% by weight), supplementation of the solution with de-ionized water to a final volume of 1 liter.

Thereafter the solution was left for a further 24 hours at the temperature of 70° C. After cooling the solution to approximately 40° C., 10 ml of solution 3 and then a further 2 ml of solution 2 were added. Thereafter the solution was ready for use.

EXAMPLE 2

Solution 4: placing of 1 liter de-ionized water, addition of 50 ml hypophosphorous acid (50% by weight).

Solution 5: dissolution of 1.5 g platinum (II) chloride in 25 ml aqueous concentrated hydrochloric acid (37% by weight), filling of the solution with deionized water to a final volume of 1 liter.

A colloidal solution as in example 1 was produced, yet instead of solution 2 solution 4 was used, and instead of solution 3, solution 5 was used.

EXAMPLE 3

Solution 6: dissolution of 2.5 g iridium (III) chloride in 25 ml aqueous concentrated hydrochloric acid (37% by weight), filling of the solution with de-ionized water to a final volume of 1 liter.

A colloidal solution as in example 1 was produced, yet instead of solution 3, solution 6 was used.

EXAMPLE 4

Solution 7: dissolution of 0.05 g rhodium (III) oxide hydrate and 0.08 g platinum (II) chloride in 25 ml aqueous concentrated hydrochloric acid (37% by weight), filling of the solution with de-ionized water to a final volume of 1 liter.

A colloid solution as in example 1 was produced, yet instead of solution 3, solution 7 was used.

The colloid solution obtained has a slightly higher oxidation sensitivity than the solutions obtained in examples 1 to 3.

EXAMPLE 5

Solution 8: dissolution of 0.08 g rhodium (III) chloride and 0.13 g iridium (III) chloride in 25 ml aqueous concentrated hydrochloric acid (37% by weight), filling of the solution with de-ionized water to a final volume of 1 liter.

A colloidal solution as in example 1 was produced, yet instead of solution 3, solution 8 was used.

The colloid solution obtained has a slightly higher oxidation sensitivity than the solutions obtained in examples 1 to 3.

EXAMPLE 6

A perforated printed circuit board was metallized in a dipping process according to the following procedure:

| Treatment | time | Temp. |
|---|---|---|
| 1. Pretreatment with a solution containing a wetting agent | 2–5 min. | 50° C. |
| Rinsing | 1–2 min. | |
| 2. Etching of copper surfaces in a hydrogen peroxide/ sulphuric acid solution | 2 min. | 25° C. |
| Rinsing | 2 min. | |
| 3. Conditioning with quaternary polyelectrolyte (e.g., polyvinyl-imidazol) (pH value: 8–9) | 5 min. | 35–60° C. |
| Rinsing | | |
| 4. Treatment with a hydrochloric sodium hypophosphite solution | 1 min. | 25° C. |
| 5. Treatment with the solution in Example 1 | 4–7 min. | 30–50° C. |
| Rinsing | | |
| 6. Treatment in an aqueous sodium thiosulphate/sodium citrate solution | 1–2 min. | 25° C. |
| 7. Cleaning of copper surfaces with diluted sulphuric acid | 1 min. | |
| 8. Electrolytic coppering (e.g., with sulphuric copper sulphate electrolyte) | | |

A dense and pore-free copper layer was obtained on the bore hole walls, which was enclosed after a few minutes of electrolysis time.

EXAMPLES 7 AND 8

A perforated printed circuit board was metallized in the dipping process according to example 6. In process stage 5, instead of the palladium colloid solution from example 1, the palladium colloid solutions from examples 2 and 3 were used.

A dense and pore-free copper layer was obtained on the bore hole walls, which was closed after a few minutes of electrolysis time.

EXAMPLES 9 TO 11

100 ml of the palladium colloid solutions, produced in accordance with examples 1 to 3, were respectively stirred in a beaker at 600 rpm on a magnetic stirrer and in this way exposed to a reinforced action of air. The electrochemical reduction/oxidation potential of the solutions was measured with a platinum electrode with reference to a silver/silver chloride reference electrode. The potential at the platinum electrode after a few minutes came to values between −170 and −250 mV and remained constant within this range. The best stability was obtained with the solution according to example 1.

EXAMPLE 12

Example 6 was repeated in a continuous-flow installation, in which the printed circuit board is guided continuously in a horizontal position between rollers, and is transported from one treatment station to the next. The treatment solutions were sprayed onto the printed circuit board and into the bore holes through nozzles. The treatment times were shorter than in example 6; they came to only 20% of the times there given. Although the palladium colloid solution in the continuous-flow installation came more intensively into contact with air due to the intensive movement of the solution, it remained stable over a long period. Even after a continuous execution of the method over a period of several days the electric chemical reduction/oxidation potential measured in the palladium colloid solution at approximately −250 mV, measured against a silver/silver chloride standard electrode, was kept approximately constant. After passing through all the stations, a dense and pore-free copper layer was obtained on the bore hole walls, which was closed after a few minutes of treatment time in the coppering solution. This result could be obtained even when the test was carried on for several days' operation.

EXAMPLE 13 (COMPARATIVE EXAMPLE)

A previously known palladium colloid, not additionally stabilized with noble metals, was produced from 870 ml de-ionized water, 100 ml of the solution 1 obtained according to example 1, and 30 ml of the solution 2 obtained according to example 2. This colloid was exposed, as in examples 9 to 11, to a reinforced action of air, and the electrochemical reduction/oxidation potential in the solution was measured. Within a few minutes after the start of the action of air, the potential changed from originally approximately −300 mV to positive values. After a short action time, values of approximately +400 mV were measured at the platinum electrode.

EXAMPLE 14

Solution 9: dissolution of 1.5 g ruthenium(III)chloride in 25 ml aqueous concentrated hydrochloric acid (37% by weight), filling of the solution with de-ionized water to a final volume of 1 liter.

A colloidal solution as in example 1 was produced, yet instead of solution 3, solution 9 was used.

EXAMPLE 15

Solution 10: dissolution of 2.5 g osmium(III)chloride in 25ml aqueous concentrated hydrochloric acid (37% by weight), filling of the solution with de-ionized water to a final volume of 1 liter.

A colloidal solution as in example 1 was produced, yet instead of solution 3, solution 10 was used.

EXAMPLE 16

Solution 11: dissolution of 2.5 g gold(III)chloride in 25 ml aqueous concentrated hydrochloric acid (37% by weight), filling of the solution with de-ionized water to a final volume of 1 liter.

A colloidal solution as in example 1 was produced, yet instead of solution 3, solution 11 was used.

EXAMPLE 17

Solution 12: dissolution of 1.5 g silver(III)nitrate in 1 liter of de-ionized water.

A colloidal solution as in example 1 was produced, yet instead of solution 3, solution 12 was used.

EXAMPLES 18–21 (COMPARATIVE EXAMPLES)

100 ml of the palladium colloid solutions, produced in accordance with examples 14 to 17, were respectively stirred in a beaker at 600 rpm on a magnetic stirrer and in this way exposed to a reinforced action of air (as in examples 9 to 11 and 13). The electrochemical reduction/oxidation potential was measured with a platinum electrode with reference to a silver/silver chloride reference electrode. Similar to example 13 and different from examples 9 to 11 the potential changed to positive values within a few minutes from the start of the action of the air.

What is claimed is:

1. A method of manufacturing a palladium colloid solution with low oxidation sensitivity, containing palladium, at least one tin-free reducing agent and at least one organic protective colloid for stabilizing the colloid solution, and at least one second noble metal selected from the group consisting of rhodium, iridium, platinum, compounds thereof and mixtures thereof, characterized by the following process steps:

a. producing a parent solution from a palladium compound, the organic protective colloid and the reducing agent in diluted aqueous hydrochloric acid, b. heating the solution to a temperature of 50° C. to 70° C., and maintaining the temperature of the solution for approximately 24 hours, and c. cooling the solution to a temperature of 20 ° C. to 40° C., and adding at least one of the second noble metal selected from the group consisting of rhodium, iridium, platinum, compounds thereof and mixtures thereof.

2. The method of claim 1, wherein step b. further includes a further addition of reducing agents to the solution.

3. A method for coating electrically non-conductive substrate surfaces with metallic layers by direct metallization of said surfaces with a palladium colloid solution with low oxidation sensitivity consisting of palladium, at least one tin-free reducing agent and at least one organic protective colloid for stabilizing the colloid solution, and at least one second noble metal selected from the group consisting of rhodium, iridium, platinum, compounds thereof and mixtures thereof, wherein the weight ratio of the second noble metal to palladium is from about 0.01:10 to 1.0:10, comprising the process steps of:

a. treating the substrate surfaces with the palladium colloid solution, b. rinsing off disturbing colloidal residues of the palladium colloid solution from the substrate surfaces, and c. metallizing the substrate surfaces with a metallizing solution electrolytically and without a currentless metal layer being previously applied.

4. The method according to claim 3 further including the step of treating the substrate surfaces between process steps b. and c. with a solution containing a sulphur compound with sulphur in the oxidation stage of at least +1 to at most +5.

5. The method of claim 4, wherein said solution containing a sulphur compound with sulphur in the oxidation stage of at least +1 to at most +5 comprises an aqueous solution of sodium thiosulphate and sodium citrate.

6. The method according to claim 3, characterized in that the substrate surfaces, before treatment according to process step a., are brought into contact with a solution containing at least one compound selected from the group consisting of quaternary and polyquaternary compounds.

7. The method of claim 6, further including the step of rinsing off the solution containing at least one compound selected from the group consisting of quaternary and polyquaternary compounds after said solution is brought into value of 1 to 3.

8. The method according to claim 3, characterized in that the substrate surfaces are metallized with a copper solution.

9. The method according to claim 3, wherein the method comprises a method for metallizing holes in printed circuit boards.

10. A method of manufacturing a palladium colloid solution with low oxidation sensitivity, containing palladium, at least one fin-free reducing agent and at least one organic protective colloid for stabilizing the colloid solution, and at least one noble metal selected from the group consisting of rhodium, iridium, platinum, compounds thereof and mixtures thereof, wherein compounds of the noble metals are selected from the group consisting of trivalent rhodium, iridium, and bivalent platinum compounds, characterized by the following process steps:

a. producing a parent solution containing the palladium, the organic protective colloid and the reducing agent in diluted aqueous hydrochloric acid, b. heating the parent solution to a temperature of 50° C. to 70° C., and maintaining the temperature of the solution for approximately 24 hours, and c. cooling the solution to a temperature of 20° C. to 40° C., and adding at least one of said noble metal.

11. The method according to claim 10, wherein step b. further includes a further addition of reducing agents to the solution.

12. A method for coating electrically non-conductive substrate surfaces with metallic layers by direct metallization of said surfaces with a palladium colloid solution with low oxidation sensitivity consisting of palladium, at least one tin-free reducing agent and at least one organic protective colloid for stabilizing the colloid solution, and at least one second noble metal selected from the group consisting of rhodium, iridium, platinum, compounds thereof and mixtures thereof, wherein the weight ratio of the second noble metal to palladium is from about 0.01:10 to 1.0:10, comprising the process steps of:

a. treating said substrate surfaces by spraying or splashing onto said substrate surfaces, the palladium colloid solution;

b. removing colloidal residues of the palladium colloid solution from the substrate surfaces after treatment in step a.; and c. metallizing the substrate surfaces with a metallizing solution electrolytically and without a currentless metal layer being previously applied.

* * * * *

UNITED STATES PATENT AND TRADEMARK OFFICE
CERTIFICATE OF CORRECTION

PATENT NO. : 6,325,910 B1
DATED : December 4, 2001
INVENTOR(S) : Heinrich Meyer and Lutz Stamp It is certified that error appears in the above-identified patent and that said Letters Patent is hereby corrected as shown below:

Column 6,
Line 48, after "polyvinyl pyridine" delete -- polyvinyl methylketone, polyninyl alcohol, polyvinyl accate, polyirnine --.

Signed and Sealed this

Sixth Day of August, 2002

Attest:

Attesting Officer

JAMES E. ROGAN
*Director of the United States Patent and Trademark Office*